United States Patent [19]
Dahl

[11] Patent Number: 5,919,259
[45] Date of Patent: Jul. 6, 1999

[54] METHOD AND APPARATUS FOR SUPPLYING POWER TO A CPU USING AN ADAPTOR CARD

[76] Inventor: Nathaniel H. Dahl, 7 Conley Dr., Bellemead, N.J. 08502

[21] Appl. No.: 08/837,480

[22] Filed: Apr. 18, 1997

[51] Int. Cl.⁶ .............................. G06F 1/26; H02M 1/00; H02M 3/06; H05K 1/11
[52] U.S. Cl. ................... 713/300; 307/130; 323/282; 361/731; 361/737; 361/764; 361/767; 361/808; 439/44; 439/59
[58] Field of Search ................... 395/750.01; 307/125, 307/126, 130; 323/282–287, 351; 361/728–731, 735–737, 748, 760, 761, 764, 767, 807–809; 363/62; 439/43, 44, 55, 59, 62, 65, 68, 74

[56] References Cited

U.S. PATENT DOCUMENTS

| | | | |
|---|---|---|---|
| 4,797,123 | 1/1989 | Weber | 439/717 |
| 4,990,847 | 2/1991 | Ishimaru et al. | 323/314 |
| 5,421,734 | 6/1995 | MacWilliams | 439/59 |
| 5,457,801 | 10/1995 | Aihara | 395/750.04 |
| 5,467,469 | 11/1995 | Saito et al. | 395/182.12 |
| 5,481,436 | 1/1996 | Werther | 361/784 |
| 5,521,854 | 5/1996 | Kadowaki et al. | 364/707 |
| 5,546,297 | 8/1996 | Duley | 363/62 |
| 5,579,524 | 11/1996 | Kikinis | 395/750.06 |
| 5,590,343 | 12/1996 | Bolan et al. | 395/750.01 |
| 5,606,713 | 2/1997 | Wisor et al. | 395/876 |
| 5,613,095 | 3/1997 | Moss et al. | 395/500 |
| 5,613,130 | 3/1997 | Teng et al. | 395/750.01 |
| 5,671,149 | 9/1997 | Brown | 702/64 |
| 5,675,472 | 10/1997 | Hamerton-Kelly | 361/684 |
| 5,683,256 | 11/1997 | Werther | 439/69 |
| 5,694,297 | 12/1997 | Smith et al. | 361/785 |
| 5,721,673 | 2/1998 | Klein | 361/809 |
| 5,748,912 | 5/1998 | Lee | 395/282 |
| 5,754,399 | 5/1998 | Wu | 361/699 |
| 5,757,171 | 5/1998 | Babcock | 323/271 |
| 5,758,108 | 5/1998 | Nakamura | 395/307 |
| 5,760,636 | 6/1998 | Noble et al. | 327/513 |
| 5,774,331 | 6/1998 | Sach | 361/683 |
| 5,864,478 | 1/1999 | McCutchan et al. | 363/147 |

FOREIGN PATENT DOCUMENTS 4120265   1/1992   Germany ............... G06K 19/07

*Primary Examiner*—Glenn A. Auve
*Assistant Examiner*—Sumati Lefkowitz
*Attorney, Agent, or Firm*—Richard C. Litman

[57] ABSTRACT

A method and apparatus for supplying power to a central processing unit (CPU) in computer systems which normally mount CPUs on a motherboard and supplies power to the CPUs via motherboard circuitry which delivers CPU current from power supply sources connected to the motherboard. The method provides the supply of partial or complete power to a CPU mounted on a computer motherboard directly from a power supply and involves the steps (a) disconnecting the power supply to the motherboard; (b) disconnecting the CPU from a CPU socket or plug on the motherboard; (c) mounting the CPU on an adaptor that can be installed in the CPU socket or plug on the motherboard; (d) installing the adaptor and the mounted CPU in the CPU socket or plug on the motherboard; (e) attaching the power supply to the adaptor to provide partial or complete power to the CPU; and, (f) attaching the power supply to the motherboard. One embodiment of the apparatus is an adaptor which mounts a CPU and then mounts into the CPU socket or plug in the motherboard. The adaptor is configured to disconnect partial or complete CPU power delivered by the motherboard and provide partial or complete CPU power directly from the power supply.

18 Claims, 3 Drawing Sheets

METHOD AND APPARATUS FOR SUPPLYING POWER TO A CPU USING AN ADAPTOR CARD

BACKGROUND OF THE INVENTION

1. Field of the Invention

The present invention relates to a method and apparatus for supplying power to a central processing unit (CPU) of a computer.

2. Description of the Prior Art

Conventionally, a computer system incorporates a power supply, or an electrical/electronic circuit that supplies all operating voltages and current to the computer system. The basic function of the power supply is to convert the type of electrical power available at a wall socket to that which is usable by computer circuitry. The power supply in a conventional desktop computer system is designed to convert 120 volt, 60 Hz, AC current into something the computer system can use, specifically, both +5 and +12 volt DC current. Usually, the digital electronic components and circuits in the system (motherboard, adapter cards, and disk drive logic boards) use the +5 volt power, and the motors (disk drive motors and any fans) use the +12 volt power. A good, steady supply of both types of current must be provided by the power supply so that the system can operate properly.

A CPU is conventionally mounted on a motherboard and receives its power from the motherboard. Motherboards can draw anywhere from 4 to 15 amps or more of +5 volt power to run. First generation Pentium CPUs were fabricated with a processing die that was overly large and complicated to manufacture. The huge die and +5 volt power caused 66 MHz versions to consume up to an incredible 3.2 amps or 16 watts of power, resulting in a tremendous amount of heat, and problems in some computer systems that did not employ conservative design techniques. Often, the computer systems required a separate fan to blow on the CPUs to keep them cool.

Second and third generation Pentium CPUs, respectively code-named P54C and P55C, were developed to run on a variety of voltages. Several different versions of the Pentium processors run on 3.3 volts, 3.465 volts, as well as 2.9 volts, 2.5 volts, and even lower in the future. However, while several of the current motherboards support the 3.3 volt or 3.465 volt CPUs, few support the 2.9 volt versions. To flexibly accommodate the variety of CPU voltages, a CPU socket named Socket 7 was developed which requires the use of a voltage regulator module (VRM). The VRM is a small circuit board that contains all the voltage regulation circuitry used to drop the +5 volt power supply signal to the correct CPU voltage. Having a replaceable VRM plugged into a socket makes it easier to replace voltage regulators should they ever fail. The uncertainty over future CPU voltage and associated electrical requirements has resulted in a need to provide computer operators with the flexibility to ensure proper power delivery to present and future CPUs. Computer system configurations are known which are concerned with providing efficient and controllable power to computer systems.

U.S. Pat. No. 5,457,801, issued Oct. 10, 1995 to Norio Aihara, describes a power-saving system for a battery-powered computer which utilizes low power consumption elements such as CMOS elements and the ability to allow or stop power supply from a power supply. However, Aihara does not provide the ability to receive partial or complete central processing unit power directly from a power supply in accordance with the present invention.

U.S. Pat. No. 5,467,469, issued Nov. 14, 1995 to Toshimitsu Saito et al., describes a computer system configuration which provides a predetermined operation such as removal of a battery, an option board, a display, an external memory or the like from a computer main body while the computer system is running, followed by resume processing, whereby the hardware and software systems of the computer system are protected against damage, etc. Saito et al. do not provide the ability to receive partial or complete central processing unit power directly from a power supply in accordance with the present invention.

U.S. Pat. No. 5,521,854, issued May 28, 1996 to Tomohiko Kadowaki et al., describes a power saving control system for a computer system which provides the ability to control the supply of electric power from a power supply to respective functional portions of a computer system. Kadowaki et al. do not provide the ability to receive partial or complete central processing unit power directly from a power supply in accordance with the present invention.

U.S. Pat. No. 5,579,524, issued Nov. 26, 1996 to Dan Kikinis, describes a power supply system for a computer system that provides a plurality of power supplies for powering different elements in the computer system. However, Kikinis does not suggest providing partial or complete power directly from a power supply in accordance with the present invention.

U.S. Pat. No. 5,590,343, issued Dec. 31, 1996 to Michael L. Bolan et al., describes the use of a power switching device which is used to connect and disconnect a computer system's power supply unit from the power-line connection. Bolan et al.s do not suggest providing partial or complete power directly from a power supply in accordance with the present invention.

U.S. Pat. No. 5,606,713, issued Feb. 25, 1997 to Michael T. Wisor et al., describes a system management interrupt source employed in a computer system. Wisor et al. do not suggest providing partial or complete power directly from a power supply in accordance with the present invention.

U.S. Pat. No. 5,613,130, issued Mar. 18, 1997 to Yen-Chang G. Teng et al., describes a power control unit for delivering proper voltage to computer system elements. Teng et al. do not suggest providing partial or complete power directly from a power supply in accordance with the present invention.

German Patent Number 4,120,265, issued on Jan. 9, 1992 to Toshiyuki Matsubara, describes a manner of operating a central processing unit with signals from a generator which can be interrupted. Matsubara does not suggest providing partial or complete power directly from a power supply in accordance with the present invention.

None of the above inventions and patents, taken either singly or in combination, is seen to describe the instant invention as claimed.

SUMMARY OF THE INVENTION

The present invention provides a method and apparatus for supplying partial or complete power to a CPU mounted on a computer motherboard directly from a power supply connected to the motherboard. The method involves the steps (a) disconnect the power supply to the motherboard; (b) disconnect the CPU from a CPU socket or plug on the motherboard; (c) mount the CPU on an adaptor that can be installed in the CPU socket or plug on the motherboard; (d) install the adaptor and the mounted CPU in the CPU socket or plug on the motherboard; (e) attach the power supply to the adaptor to provide partial or complete power to the CPU; and, (f) attach the power supply to the motherboard.

One embodiment of the apparatus according to the present invention involves the use of an adaptor which mounts a CPU and then mounts into the CPU socket or plug in the motherboard. The adaptor is configured to disconnect partial or complete CPU power delivered by the motherboard and provide partial or complete CPU power directly from the power supply.

Accordingly, it is a principal object of the invention to provide a method and apparatus for supplying partial or complete power to a CPU mounted on a computer motherboard directly from a power supply connected to the motherboard.

It is another object of the invention to enable the use of the method and apparatus in a computer system that employs a zero insertion force CPU socket, such as a Socket 5 or a Socket 7.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
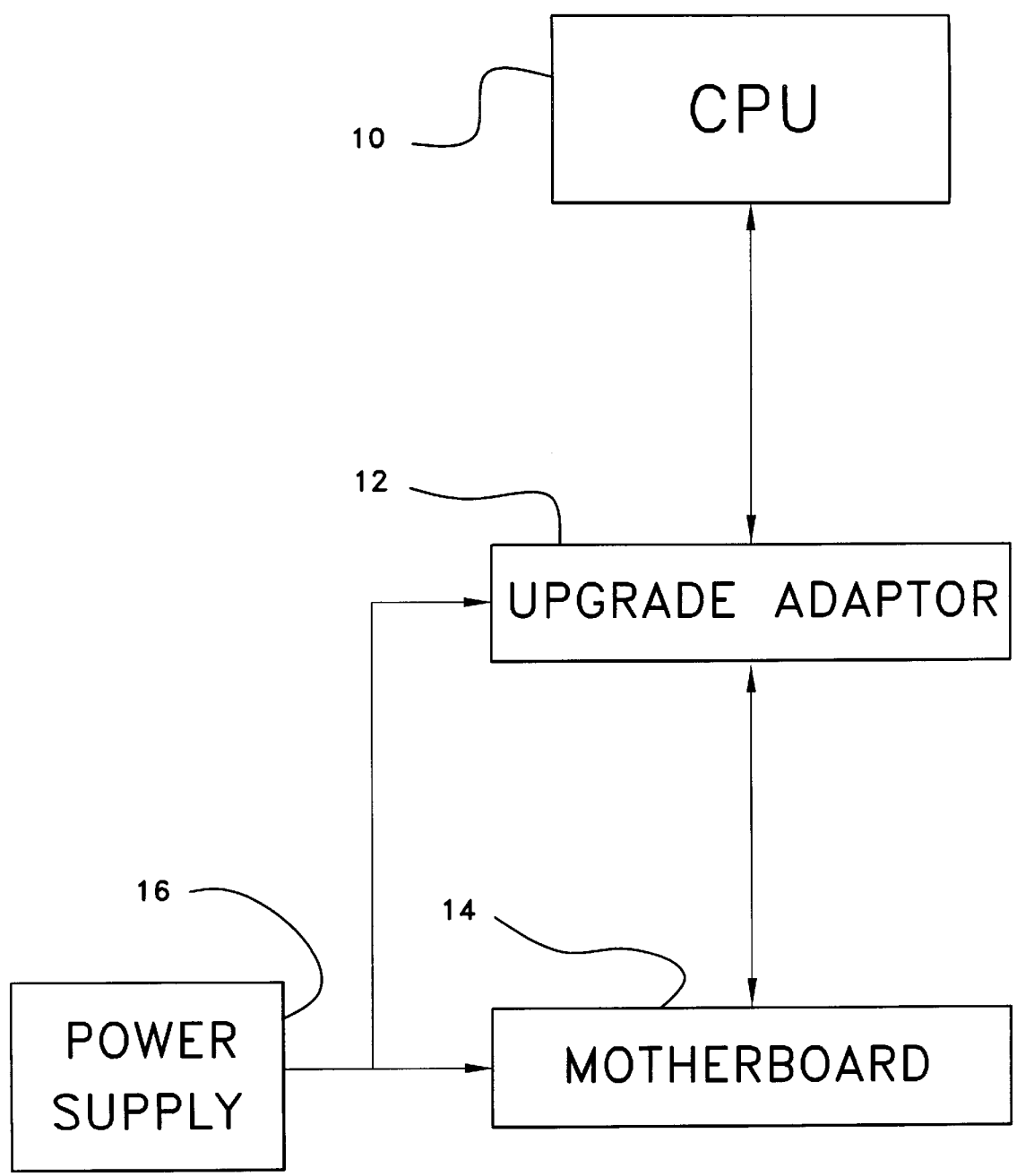
FIG. 1 is block diagram showing the basic apparatus and concept of the present invention.
Figure 2:
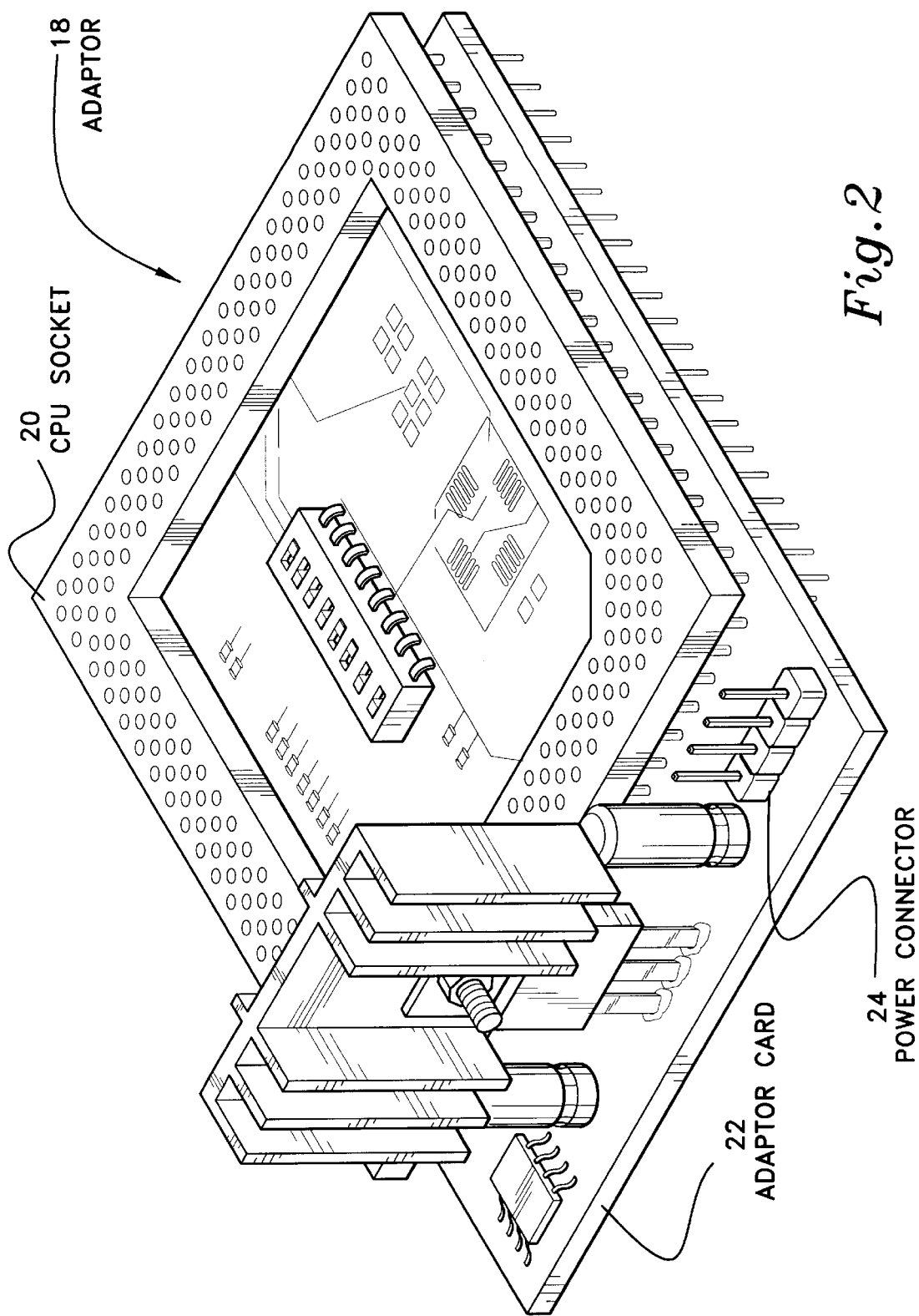
FIG. 2 is a rear perspective view of an embodiment of an adaptor according to the invention.
Figure 3:
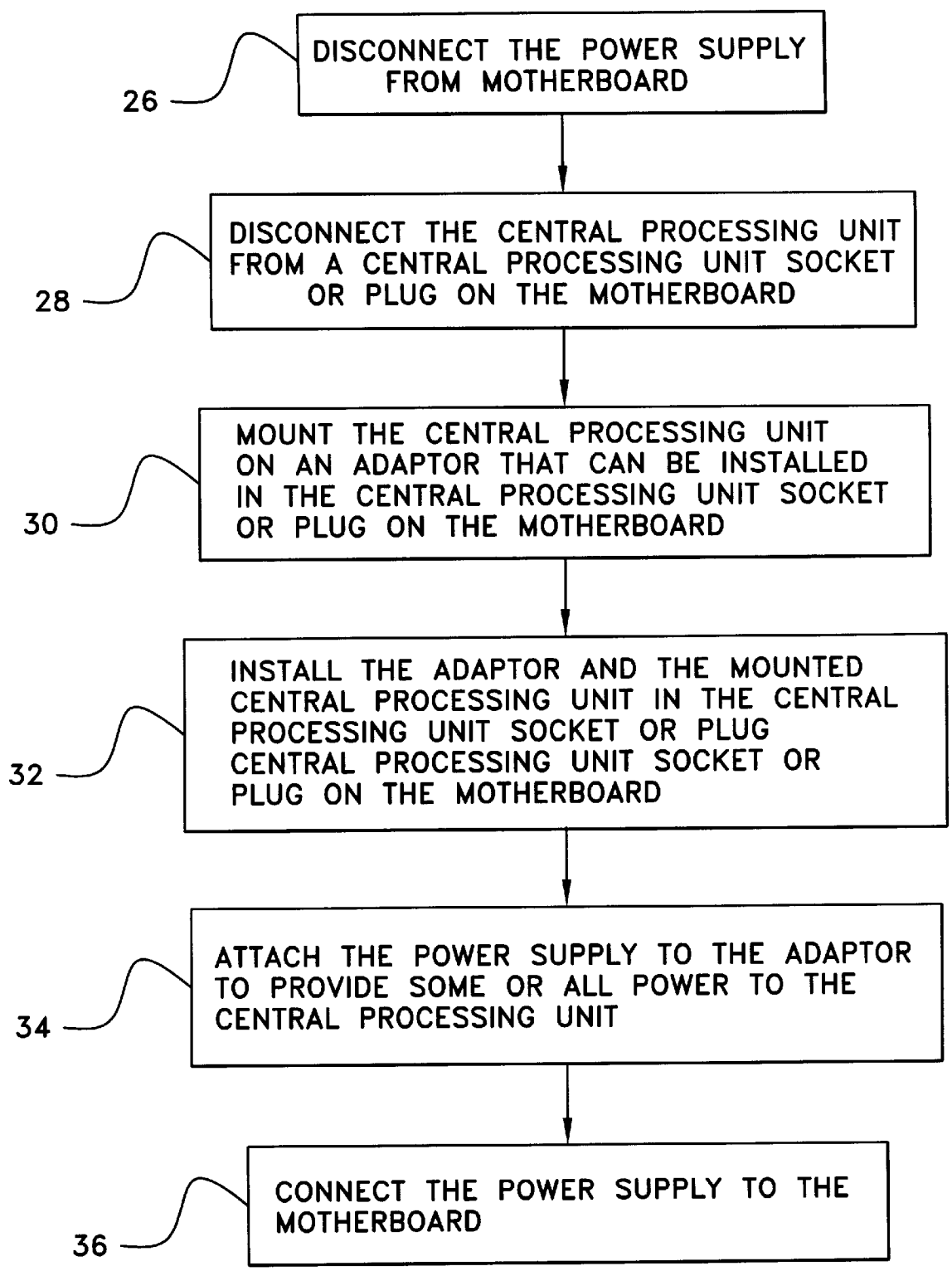
FIG. 3 is a block diagram showing a central processing unit power reconfiguration methodology according to the present invention.

Referring to FIGS. 1–3, the present invention involves a method and apparatus. As shown in FIG. 1, the basic inventive idea involves the use of an upgrade adaptor 12 which mounts a CPU 10 and is mounted in a CPU socket, module or daughterboard attached to a computer motherboard 14. A power supply 16 is normally connected to the motherboard 14 which delivers power to a motherboard mounted CPU 10. The upgrade adaptor 12 includes a connection for the power supply 16 and circuitry for partially or completely eliminating motherboard 14 CPU power delivery. This technique enables a motherboard that has been designed for a CPU with particular electrical characteristics to be able to function with a CPU with different electrical characteristics.

A method for supplying power to CPU 10 mounted on motherboard 14 and provided partial or complete power directly from power supply 16 connected to motherboard 14 includes the steps shown in FIG. 3: (a) disconnect the power supply 16 from the motherboard 14; (b) disconnect the CPU 10 from a central processing unit socket or plug on the motherboard 14; (c) mount the CPU 10 on an adaptor 12 that can be installed in the CPU socket or plug on the motherboard 14; (d) install the adaptor 12 and the mounted CPU 10 in the central processing unit socket or plug on the motherboard 14; (e) attach the power supply 16 to the adaptor 12 to directly provide partial or complete power to the CPU 10; and, (f) attach the power supply 16 to the motherboard 14.

The adaptor 12 includes a CPU socket that corresponds to the CPU socket on the motherboard 14. One embodiment of an adaptor 18 is shown in FIG. 2. A CPU socket 20 is included on the adaptor 18 and is connected to a card 22 which includes a connector 24 for the power supply and circuitry for partially or completely eliminating the capability of the adaptor 18 to deliver motherboard CPU power. The card 22 additionally includes pin connections enabling insertion into a corresponding motherboard CPU socket. Motherboard CPU sockets are conventionally zero insertion force (ZIF) sockets, such as sockets known as Socket 5 and Socket 7. The adaptor 18 could also be configured to enable insertion into a module or a daughterboard.

It is to be understood that the present invention is not limited to the embodiments described above, but encompasses any and all embodiments within the scope of the following claims.

I claim:

1. A method for interchanging a first central processing unit with a second central processing unit, the method comprising the steps:

(a) disconnect a power supply from a computer motherboard which has mounted thereon a first central processing unit having electrical characteristics;

(b) disconnect the first central processing unit from a central processing unit socket, module or daughterboard attached to the computer motherboard, the central processing unit socket, module or daughterboard being able to allow passage of central processing unit power therethrough;

(c) mount a second central processing unit having electrical characteristics that differ from the electrical characteristics of the first central processing unit on an adaptor having an upper surface and a lower surface, said adaptor being adapted for installation in the central processing unit socket, module or daughterboard attached to the computer motherboard, said upper surface having power supply connection means mounted thereon;

(d) install the adaptor and the second central processing unit mounted thereon in the central processing unit socket, module or daughterboard attached to the computer motherboard;

(e) connect the power supply with the power supply connection means mounted on the upper surface of the adaptor for direct application of power to the second central processing unit from the power supply; and, (f) connect the power supply to the computer motherboard, wherein the motherboard and the second central processing unit are independently powered from the power supply.

2. The method for supplying power to a central processing unit according to claim 1, wherein the central processing unit socket, module or daughterboard is a zero insertion force socket or plug.

3. The method for supplying power to a central processing unit according to claim 2, wherein the central processing unit socket, module or daughterboard is a Socket 5.

4. The method for supplying power to a central processing unit according to claim 2, wherein the central processing unit socket, module or daughterboard is a Socket 7.

5. The method for supplying power to a central processing unit according to claim 1, wherein the central processing unit is adapted to receive partial power directly from the power supply.

6. The method for supplying power to a central processing unit according to claim 1, wherein the central processing unit is adapted to receive all power directly from the power supply.

7. In combination with a computer system including a power supply and a computer motherboard with a central processing unit mounted in a central processing unit socket, module or daughterboard attached to the computer motherboard, the central processing unit socket, module or daughterboard being able to allow passage of central processing unit power therethrough, an adaptor for enabling the interchange on the computer motherboard of a first central processing unit having electrical characteristics with a second central processing unit having electrical characteristics that differ from the electrical characteristics of the first central processing unit, and for enabling central processing unit power to be delivered directly from the power supply to a central processing unit mounted on the adaptor, wherein said adaptor has an upper surface and a lower surface, said upper surface having power supply connection means mounted thereon that enables direct application of power from the power supply to a central processing unit mounted on the adaptor, and that enables independent application of power from the power supply to the computer motherboard and to a central processing unit mounted on the adaptor.

8. The combination according to claim 7, wherein the central processing unit socket, module or daughterboard is a zero insertion force socket.

9. The combination according to claim 7, wherein the central processing unit socket, module or daughterboard is a Socket 5.

10. The combination according to claim 7, wherein the central processing unit socket, module or daughterboard is a Socket 7.

11. The combination according to claim 7, wherein the central processing unit is adapted to receive partial power from the power supply.

12. The combination according to claim 7, wherein the central processing unit is adapted to receive complete power from the power supply.

13. An adaptor including means for enabling the interchange on a computer motherboard of a first central processing unit having electrical characteristics with a second central processing unit having electrical characteristics that differ from the electrical characteristics of the first central processing unit, and for enabling central processing unit power to be delivered directly from a power supply to a central processing unit mounted on the adaptor in a computer system wherein a central processing unit is mounted in a central processing unit socket, module or daughterboard attached to a computer motherboard, the central processing unit socket, module or daughterboard being able to allow passage of central processing unit power therethrough, said adaptor having an upper surface and a lower surface, said upper surface having power supply connection means mounted thereon that enables direct application of power from the power supply to a central processing unit mounted on the adaptor, and that enables independent application of power from the power supply to the computer motherboard and to a central processing unit mounted on the adaptor.

14. The adaptor according to claim 13, wherein the central processing unit socket, module or daughterboard is a zero insertion force socket.

15. The adaptor according to claim 13, wherein the central processing unit socket, module or daughterboard is a Socket 5.

16. The adaptor according to claim 13, wherein the central processing unit socket, module or daughterboard is a Socket 7.

17. The combination according to claim 13, wherein the central processing unit is adapted to receive partial power from the power supply.

18. The combination according to claim 13, wherein the central processing unit is adapted to receive complete power from the power supply.

* * * * *